(12) United States Patent
Yan et al.

(10) Patent No.: US 9,941,348 B2
(45) Date of Patent: Apr. 10, 2018

(54) METHOD OF FORMING A CAPACITOR STRUCTURE AND CAPACITOR STRUCTURE

(71) Applicant: GLOBALFOUNDRIES Inc., Grand Cayman (KY)

(72) Inventors: Ran Yan, Dresden (DE); Ming-Cheng Chang, Dresden (DE); Ralf Richter, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/142,332

(22) Filed: Apr. 29, 2016

(65) Prior Publication Data

US 2017/0317161 A1 Nov. 2, 2017

(51) Int. Cl.
*H01L 21/02* (2006.01)
*H01L 49/02* (2006.01)
*H01L 21/762* (2006.01)

(52) U.S. Cl.
CPC ........ *H01L 28/84* (2013.01); *H01L 21/76283* (2013.01); *H01L 28/40* (2013.01); *H01L 28/82* (2013.01)

(58) Field of Classification Search
CPC ........... H01L 27/1203; H01L 27/76224; H01L 29/66181; H01L 29/945; H01L 28/40–28/92; H01L 27/1087; H01L 27/10894; H01L 27/10829; H01L 27/10897; H01L 27/0805–27/0811; H01L 21/76229; H01L 21/76262; H01L 21/76831; H01L 21/823481; H01L 21/823878; H01L 21/762–21/76297; H01L 29/407; H01L 21/76283; H01L 21/76224–21/76237
See application file for complete search history.

(56) References Cited

U.S. PATENT DOCUMENTS

| | | | | |
|---|---|---|---|---|
| 6,306,720 B1 * | 10/2001 | Ding | ................. | H01L 29/66181 257/E21.396 |
| 2006/0244061 A1 * | 11/2006 | Nowak | ............... | H01L 27/0805 257/347 |
| 2007/0001203 A1 * | 1/2007 | Lehr | ..................... | H01L 29/945 257/296 |
| 2009/0039466 A1 * | 2/2009 | Sanada | ................... | H01L 28/82 257/532 |

(Continued)

*Primary Examiner* — Eric Ward
*Assistant Examiner* — Eric Ashbahian
(74) *Attorney, Agent, or Firm* — Amerson Law Firm, PLLC

(57) ABSTRACT

The present disclosure provides a method of forming a capacitor structure and a capacitor structure. A semiconductor-on-insulator substrate is provided comprising a semiconductor layer, a buried insulating material layer and a semiconductor substrate material. A shallow trench isolation structure defining a first active region on the SOI substrate is formed, the first active region having a plurality of trenches formed therein. Within each trench, the semiconductor substrate material is exposed on inner sidewalls and a bottom face. A layer of insulating material covering the exposed semiconductor substrate material is formed, and an electrode material is deposited on the layer of insulating material in the first active region.

20 Claims, 9 Drawing Sheets

(56) References Cited

U.S. PATENT DOCUMENTS

| | | | | |
|---|---|---|---|---|
| 2012/0061798 A1* | 3/2012 | Wong | ............... | H01L 27/10861 |
| | | | | 257/532 |
| 2012/0139080 A1* | 6/2012 | Wang | ................... | H01L 21/743 |
| | | | | 257/506 |
| 2012/0286392 A1* | 11/2012 | Pei | ................... | H01L 27/10829 |
| | | | | 257/532 |
| 2013/0270620 A1* | 10/2013 | Hu | ................... | H01L 21/76229 |
| | | | | 257/296 |
| 2014/0145299 A1* | 5/2014 | Kalnitsky | .............. | H01L 28/91 |
| | | | | 257/532 |

* cited by examiner

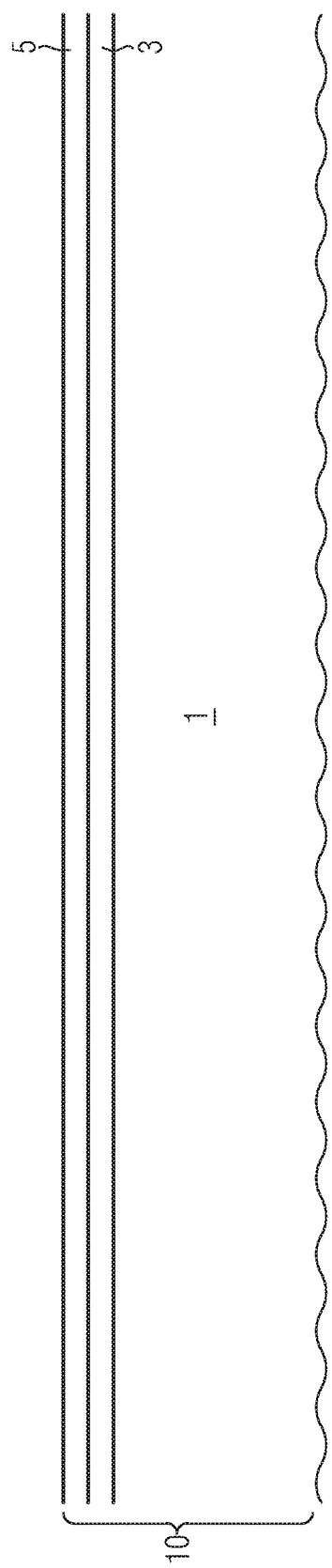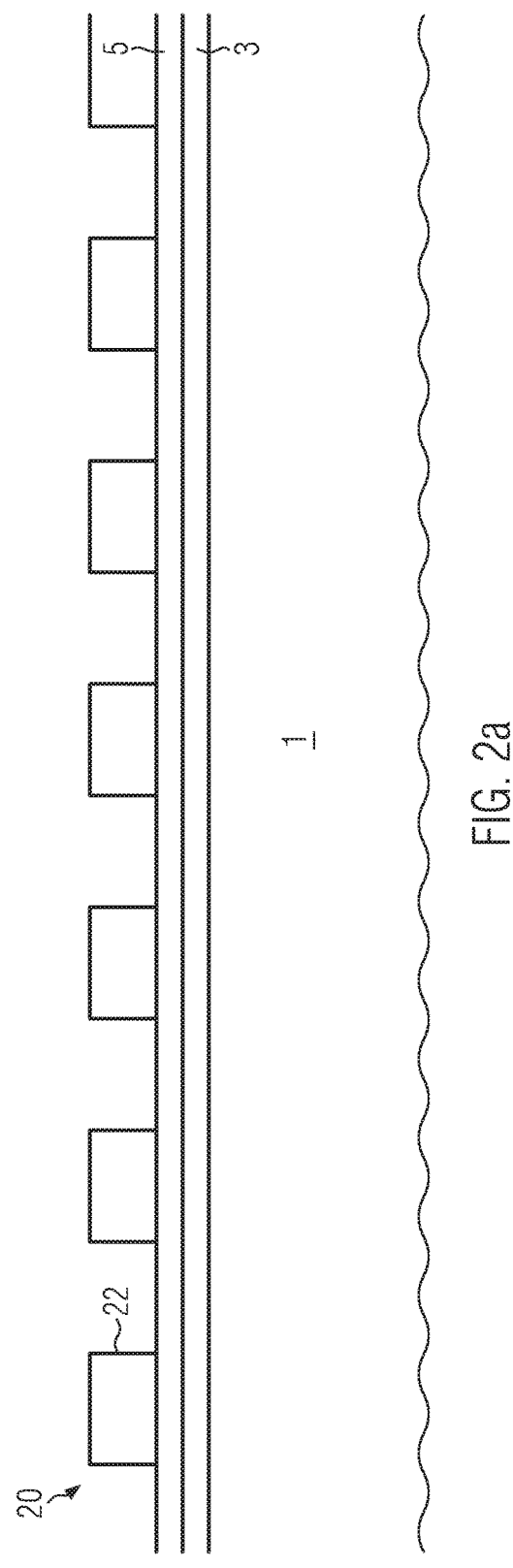

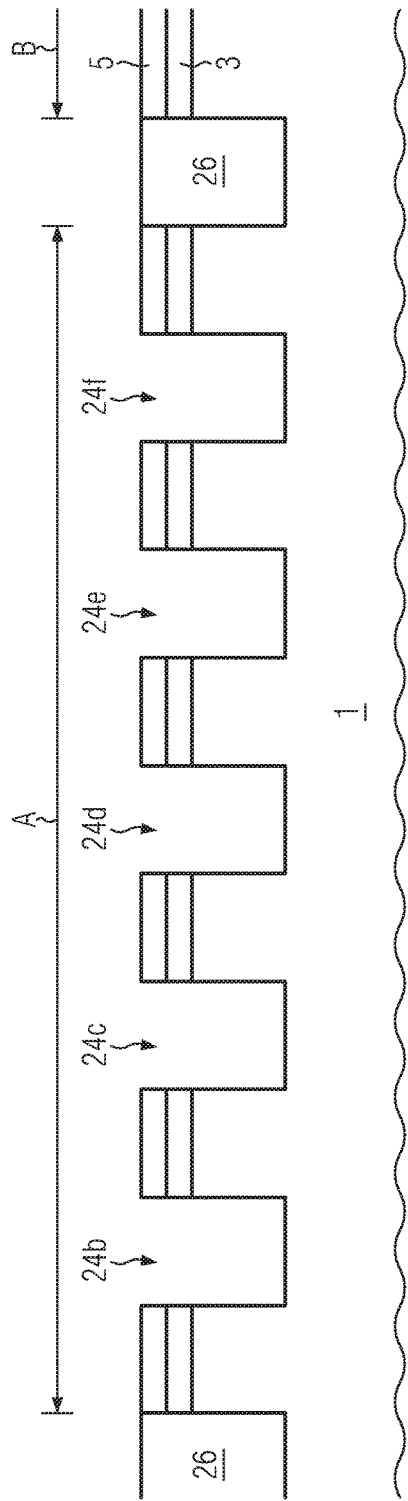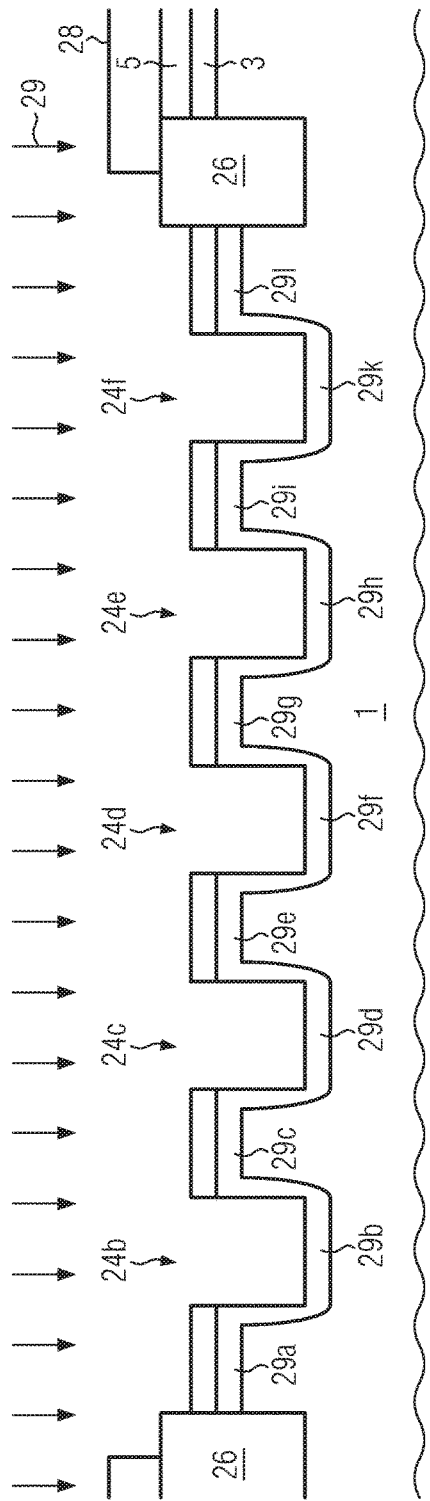

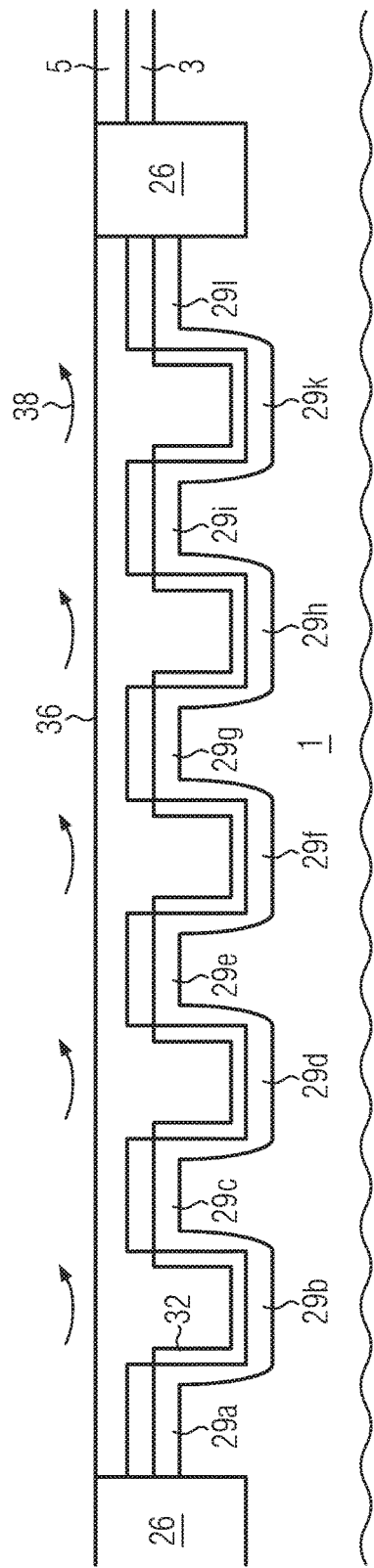
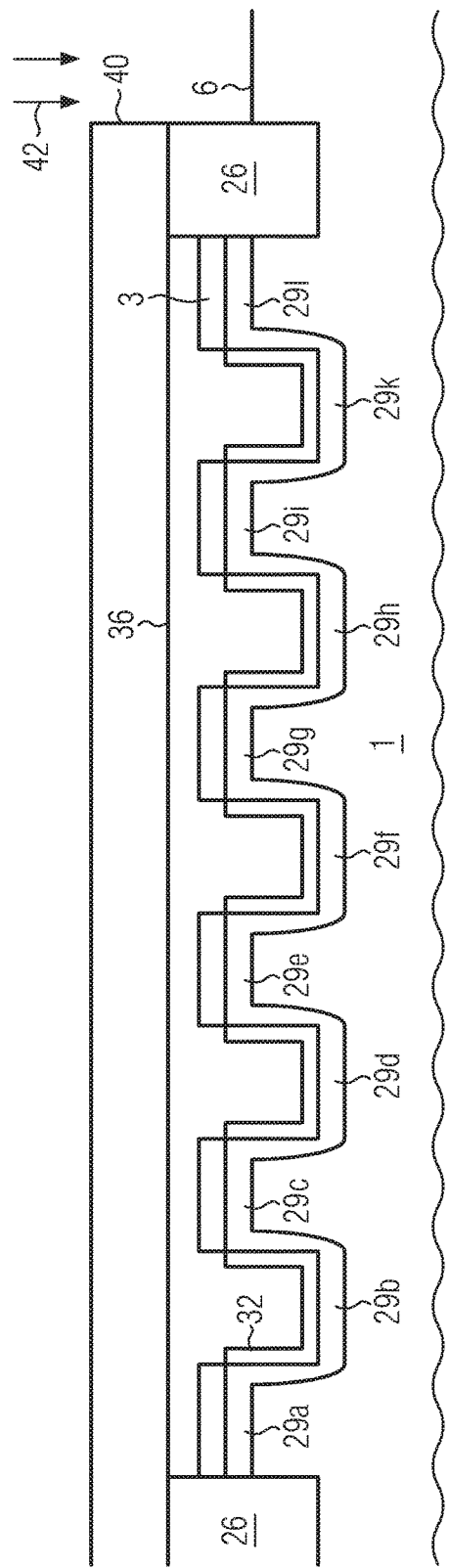

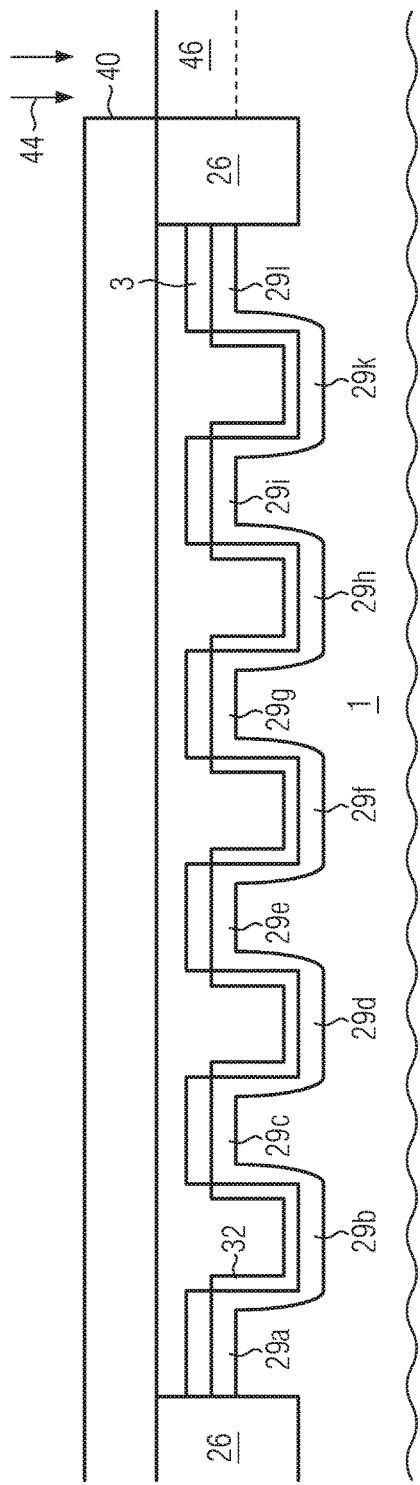
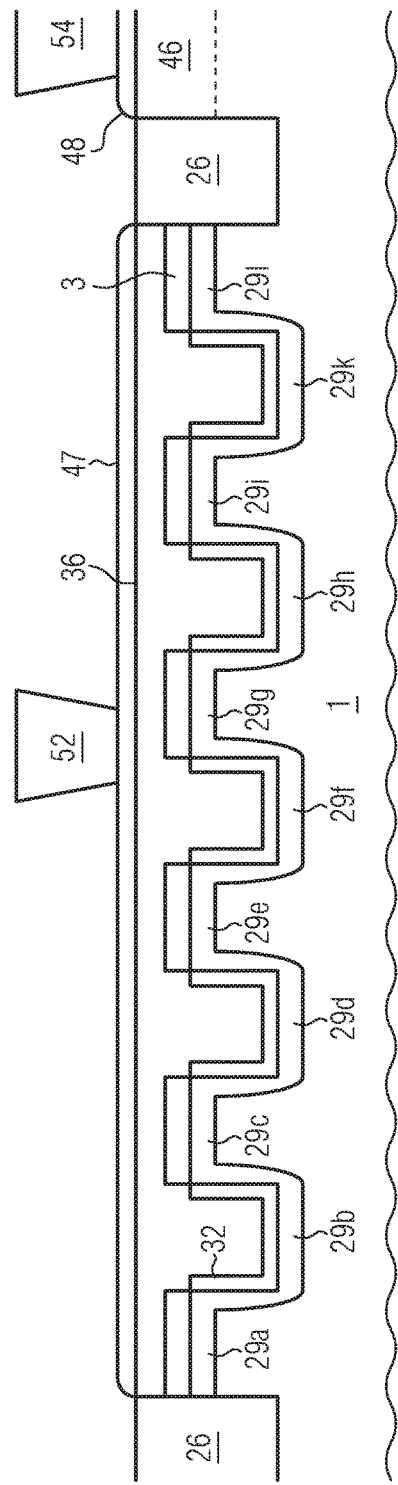

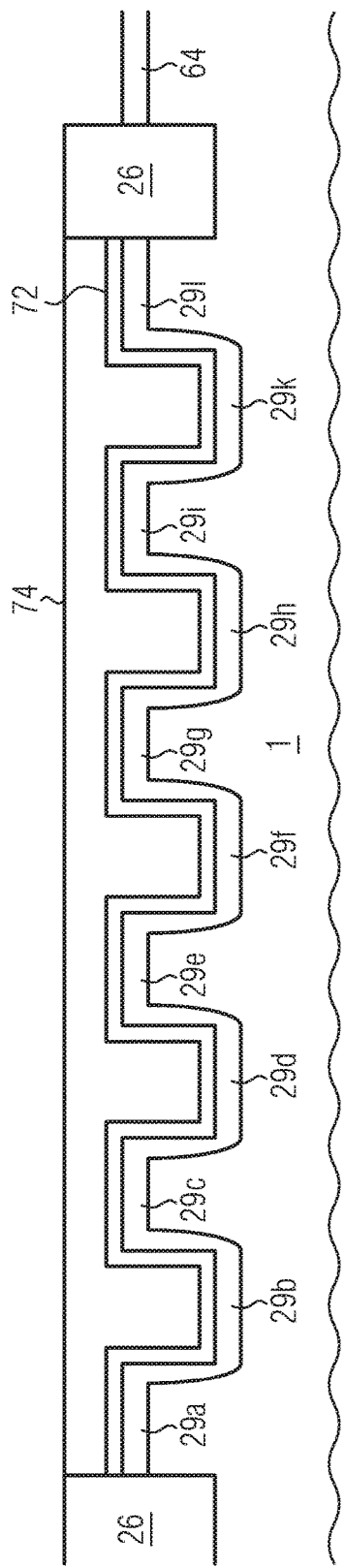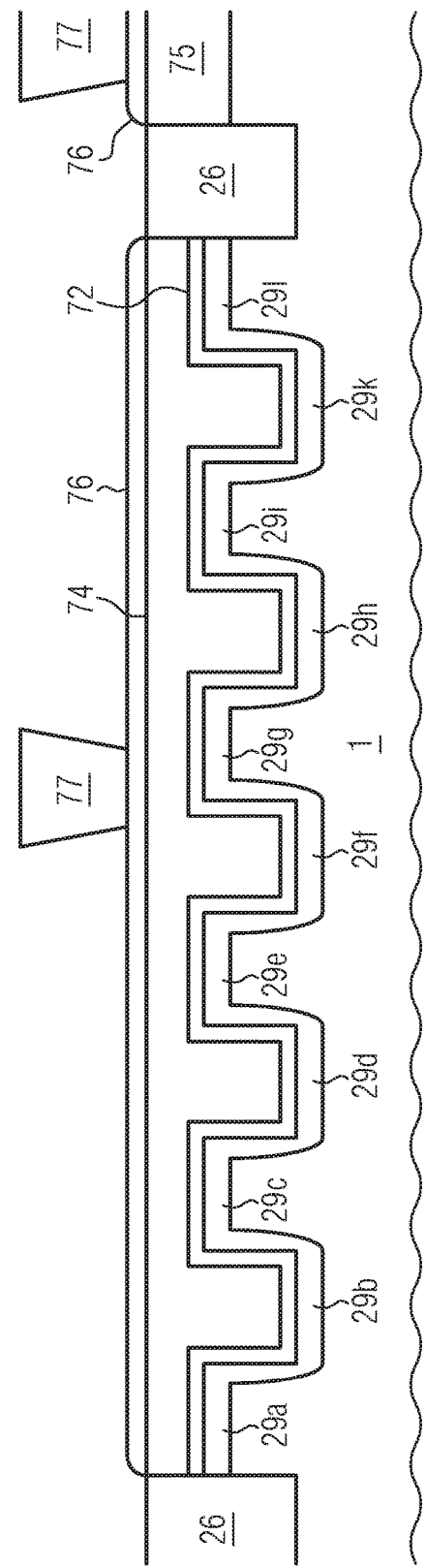

US 9,941,348 B2

METHOD OF FORMING A CAPACITOR STRUCTURE AND CAPACITOR STRUCTURE

BACKGROUND

1. Field of the Disclosure

The present disclosure relates to a method of forming a capacitor structure and to a capacitor structure.

2. Description of the Related Art

In the ongoing task to comply with constraints imposed by Moore's Law, FDSOI ("fully depleted silicon-on-insulator") seems to be a promising candidate for next generation technologies in the fabrication of semiconductor devices at technology nodes of 22 nm and beyond. Aside from FDSOI allowing the combination of high performance and low power consumption, complemented by an excellent responsiveness to power management design techniques, fabrication processes as employed in FDSOI techniques are comparatively simple and actually represent a low risk evolution of conventional planar bulk CMOS techniques when compared to multidimensional semiconductor devices, such as FinFETs.

In general, SOI techniques make use of a special kind of substrate being formed by a semiconductor layer, such as silicon, germanium or silicon germanium, formed on a buried oxide (BOX) layer, which is in turn formed on a semiconductor substrate. For example, in the case of an N-type SOI device, a P-type semiconductor film is sandwiched between a gate oxide (GOX) and the BOX layer. Conventionally, there are two types of SOI devices: PDSOI (partially depleted SOI) and FDSOI devices, where the thickness of the BOX layer is greater in PDSOI than in FDSOI.

Aside from transistor devices (mostly MOSFET devices) representing main components of integrated circuits, passive devices, such as capacitors, are often employed in integrated circuits. For example, decoupling capacitors are required for stabilizing a chip's power supply and reducing noise, while routing effects in metallization layers may be overcome and signal integrity may be improved when using a decoupling capacitor which provides a good return path. In general, decoupling capacitors are required to have a low series resistance and a high Q factor.

It is desirable to provide a capacitor structure at, for example, advanced technology nodes, wherein the capacitor structure has a high capacitance at low area consumption.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides, in a first aspect, a method of forming a capacitor structure. In accordance with some illustrative embodiments herein, the method includes providing a semiconductor-on-insulator (SOI) substrate, the SOI substrate comprising a semiconductor layer, a buried insulating material layer and a semiconductor substrate material, forming a shallow trench isolation (STI) structure defining a first active region on the SOI substrate, forming a plurality of trenches in the first active region, the semiconductor substrate material being exposed on inner sidewalls and a bottom face of each trench of the plurality of trenches, forming a layer of insulating material over the first active region, the layer of insulating material covering the exposed semiconductor substrate material, and depositing an electrode material on the layer of insulating material in the first active region.

In a second aspect of the present disclosure, a capacitor structure is provided. In accordance with some illustrative embodiments herein, the capacitor structure includes a semiconductor-on-insulator (SOI) substrate, the SOI substrate comprising a semiconductor layer, a buried insulating material layer and a semiconductor substrate material, a shallow trench isolation (STI) structure defining a first active region in the SOI substrate, a plurality of trenches formed in the first active region, the semiconductor substrate material being exposed on inner sidewalls and a bottom face of each trench of the plurality of trenches, a layer of insulating material formed over the first active region, the layer of insulating material covering the exposed semiconductor substrate material, and an electrode material formed on the layer of insulating material in the first active region.

BRIEF DESCRIPTION OF THE DRAWINGS

The disclosure may be understood by reference to the following description taken in conjunction with the accompanying drawings, in which like reference numerals identify like elements, and in which:

FIG. 1 schematically illustrates an SOI substrate in accordance with some illustrative embodiments of the present disclosure;

FIGS. 2a-2h schematically illustrate, in cross-sectional views, a process flow in accordance with some illustrative embodiments of the present disclosure;

FIGS. 3a-3c schematically illustrate, in cross-sectional views, a process flow in accordance with some other illustrative embodiments of the present disclosure; and FIGS. 4a-4f schematically illustrate, in cross-sectional views, a process flow in accordance with still another illustrative embodiment of the present disclosure.

Figure 2B:
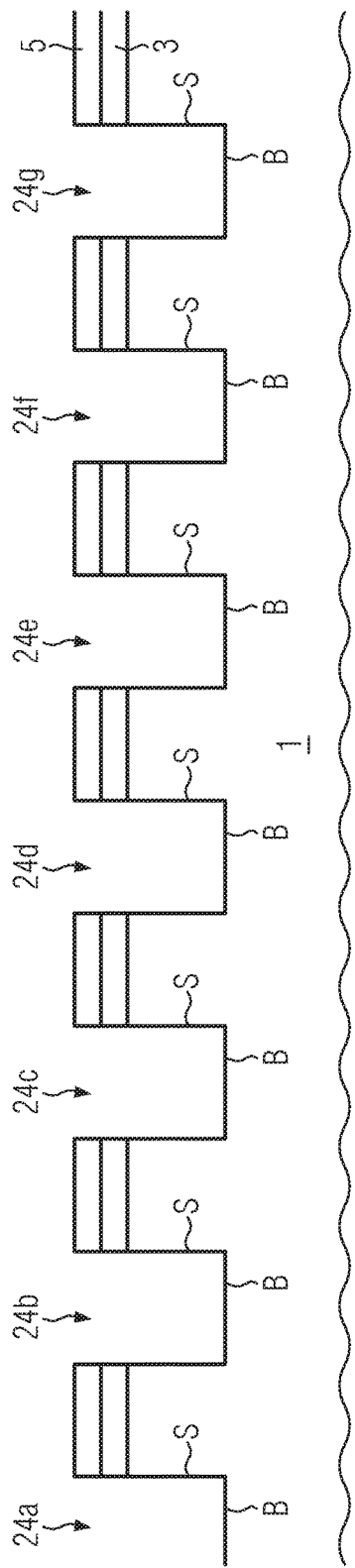

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In various aspects, the present disclosure relates to a method of forming a capacitor structure and to a capacitor structure, wherein the capacitor structures are integrated on or in a chip. In accordance with some illustrative embodiments of the present disclosure, the capacitor structure may substantially represent a metal-insulator-metal (MIM) structure. When referring to MIM structures, the person skilled in the art will appreciate that, although the expression "MIM structure" is used, no limitation to metal-containing electrode materials is intended as any conductive material may be employed for one or more of the electrodes.

Capacitor structures of the present disclosure may concern structures which are fabricated by using advanced technologies, i.e., the capacitor structures may be fabricated by technologies applied to approach technology nodes smaller than 100 nm, for example, smaller than 50 nm or smaller than 35 nm, e.g., at 22 nm or below. After a complete reading of the present application, a person skilled in the art will appreciate that, according to some illustrative examples described herein, ground rules smaller or equal to 45 nm, e.g., at 22 nm or below, may be imposed. After a complete reading of the present application, a person skilled in the art will appreciate that, in some embodiments, the present disclosure proposes capacitor structures having minimal length dimensions and/or width dimensions smaller than 100 nm, for example, smaller than 50 nm or smaller than 35 nm or smaller than 22 nm. For example, the present disclosure may provide structures fabricated by using 45 nm technologies or below, e.g., 22 nm or even below.

In accordance with the present disclosure, FDSOI substrates may have a thin (active) semiconductor layer disposed on a buried insulating material layer, which, in turn, is formed on a substrate material. In accordance with some illustrative embodiments herein, the semiconductor layer may comprise one of silicon, silicon germanium and the like. The buried insulating material layer may comprise an insulating material, e.g., silicon oxide or silicon nitride. The semiconductor substrate material may be a base material that is used as a substrate in the art, e.g., silicon, silicon germanium and the like. The person skilled in the art will appreciate that, in accordance with FDSOI substrates, the semiconductor layer may have a thickness of 20 nm or less, while the buried insulating material layer may have a thickness of about 145 nm or, in accordance with advanced techniques, the buried insulating material layer may have a thickness in a range from 10-30 nm. For example, in some illustrative embodiments of the present disclosure, the semiconductor layer may have a thickness of 6-10 nm.

FIG. 1 schematically shows, in a cross-sectional view, an upper surface portion of a semiconductor-on-insulator (SOI) substrate 10, comprising a semiconductor substrate material 1, a buried insulating material layer 3 and a semiconductor or active layer 5. In accordance with illustrative embodiments of the present disclosure, the semiconductor substrate material 1 may comprise monocrystalline silicon having a plane orientation of (100). The semiconductor layer 5 may be, for example, P-type monocrystalline silicon having a plane orientation of (100), a crystal orientation (110) or (100) parallel to an orientation flat or notch, and a thickness of 30 nm or less. In accordance with some illustrative embodiments of the present disclosure, the buried insulating material layer 2 may be formed of a silicon oxide film having a thickness of 10 nm or less, though this does not pose any limitation on the present disclosure and silicon nitride may be used instead.

In accordance with illustrative embodiments of the present disclosure, the SOI substrate 10 may be provided at an early stage during fabrication of a capacitor structure.

With regard to FIGS. 2a-2d, a process flow starting at an early stage during fabrication of a capacitor structure in accordance with some illustrative embodiments of the present disclosure will be described.

FIG. 2a schematically illustrates the SOI substrate 10 of FIG. 1 at an early stage during fabrication, after a masking pattern 20 is formed on an exposed upper surface of the semiconductor layer 5. In accordance with illustrative embodiments of the present disclosure, the masking pattern 20 may, in accordance with some special illustrative examples, comprise a patterned photoresist 22, which may be patterned in accordance with known photolithography techniques.

FIG. 2b schematically illustrates the SOI substrate 10 of FIG. 2a at a more advanced stage during fabrication, after a plurality of trenches 24a to 24g are formed in the SOI substrate 10 in accordance with the masking pattern 20 of FIG. 2a. As indicated in FIG. 2b, the masking pattern 20 may be exposed to an anisotropic etching process for successively/sequentially etching the trenches 24a to 24g into the semiconductor layer 5, the buried insulating material layer 3, and partially into the semiconductor substrate material 1. For example, the anisotropic etching process may comprise a first etch step for anisotropically etching the semiconductor layer 5, using the buried insulating material layer 3 as an etch stop (alternatively, the first etch step may be time controlled). The anisotropic etching process may further comprise a second etch step for anisotropically etching the buried insulating material layer 3, using the semiconductor substrate material 1 as an etch stop (alternatively, the second etching process may be time controlled).

In accordance with FIG. 2b, after having formed the plurality of trenches 24a to 24g, the semiconductor substrate material 1 may be exposed on inner sidewalls S and a bottom face B of each of the trenches 24a to 24g. In accordance with some illustrative embodiments of the present disclosure, each trench of the plurality of trenches 24a to 24g may have a depth up to 300 nm.

Figure 2C:
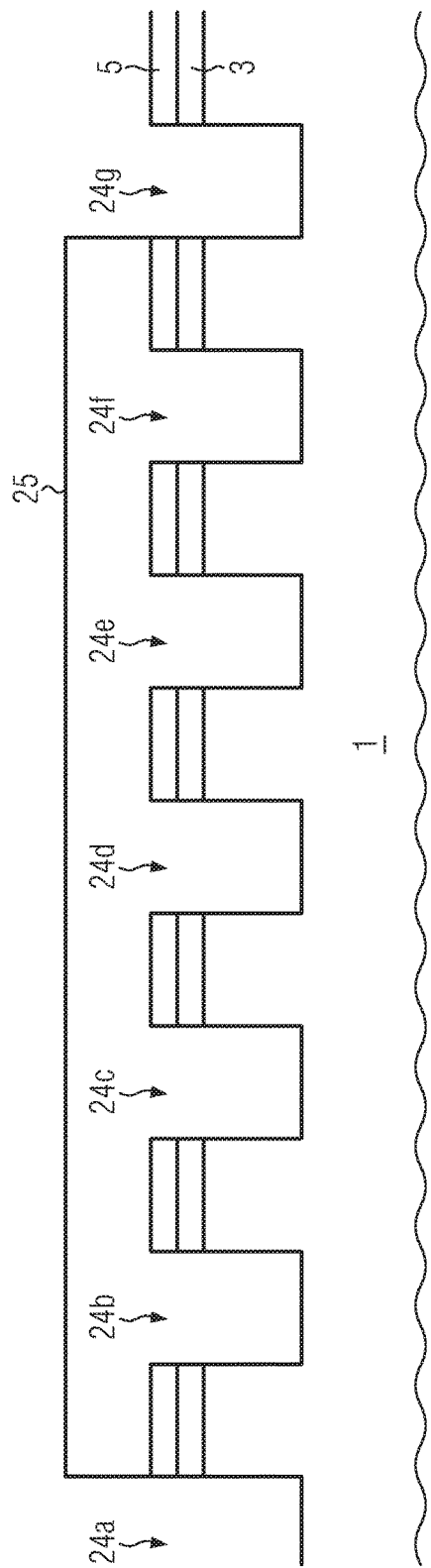

FIG. 2c schematically illustrates the structure of FIG. 2b at a more advanced stage during fabrication, after a masking pattern 25 is formed, the masking pattern covering a subset of the plurality of trenches, such as the trenches 24b to 24f, while leaving some of the trenches, such as the trenches 24*a* and 24*g* in FIG. 2*c*, exposed to further processing. In accordance with some illustrative embodiments of the present disclosure, the masking pattern 25 may be formed so as to cover a first active region having the trenches 24*b*, 24*c*, 24*d*, 24*e* and 24*f*, wherein the first active region is surrounded by trenches, i.e., the trenches 24*a* and 24*g*, laterally delimiting a first active region.

FIG. 2*d* schematically illustrates the structure as illustrated in FIG. 2*c* at a more advanced stage during fabrication, after a first active region A is defined upon filling the trenches 24*a* and 24*g* with an insulating material in alignment with the masking pattern 25. Accordingly, STI regions 26 are formed, the STI regions 26 delimiting the first active region A against adjacent active regions, such as a second active region B. Therefore, the STI regions 26 define the first active region A, wherein the first active region A has the trenches 24*b* to 24*f*. After having formed the STI regions 26, the masking pattern (i.e., 25 in FIG. 2*c*) may be removed in accordance with known techniques, such as stripping and the like.

At the end of the fabrication stage illustrated in FIG. 2*d*, the SOI substrate (10 in FIG. 1) is processed, resulting in a plurality of active regions (A and B in FIG. 2*d*) being separated by STI regions (26 in FIG. 2*d*), wherein the first active region (A in FIG. 2*d*) comprises a plurality of trenches (24*b* to 24*f* in FIG. 2*d*) which are formed in the first active region (A in FIG. 2*d*).

Subsequently, as schematically illustrated in FIG. 2*e*, a masking pattern 28 may be formed over the first and second active regions (i.e., A and B in FIG. 2*d*, in the following, the first active region is to be understood as being defined in accordance with reference numeral A in FIG. 2*d*, while the second active region is to be understood in accordance with reference numeral B in FIG. 2*d*), leaving the first active region exposed to further processing, while at least the second active region may be protected from further processing.

Subsequently, an implantation process 29 may be performed, the implantation process 29 comprising implanting dopants of P-type conductivity (acceptors) or N-type conductivity (donors) into the first active region, wherein doped regions 29*a* to 29*l* are formed in the semiconductor substrate material 1.

In accordance with some illustrative embodiments of the present disclosure, the doped regions 29*a* to 29*l* may have an increased concentration of a donor species, wherein appropriate donor species for providing N-type conductivity regions are known in the art, e.g., phosphorus for doping silicon. Alternatively, appropriate acceptor species are known in the art and may be implanted when forming P-type doped regions 29*a* to 29*l*, e.g., boron for doping silicon.

In accordance with some illustrative embodiments, doped regions may be formed at least in the bottom (reference numeral B in FIG. 2*b*) by implanting dopants into the first active region (reference numeral A in FIG. 2*d*) in alignment with the masking pattern 28 along a direction which is substantially normal to an upper surface of the active semiconductor layer 5 and the substrate material 1. Additionally, one or more tilted (differing from the normal direction) implantations may be performed. For example, the wafer may be rotated at least one time for implementing at least one tilted implantation. In accordance with some illustrative examples, four implantations having four different tilting angles relative to the normal direction are performed for forming doped regions in the sidewalls (reference numeral S in FIG. 2*b*) in addition to the doped regions 29*a* to 29*l*. After a complete lecture of the present disclosure, the person skilled in the art will appreciate that this does not pose any limitation on the present disclosure and that no tilted implantation may be performed, in which case on the doped region 29*a* to 29*l* may be formed (no doped region along the sidewalls S in FIG. 2*b*).

Figure 2F:
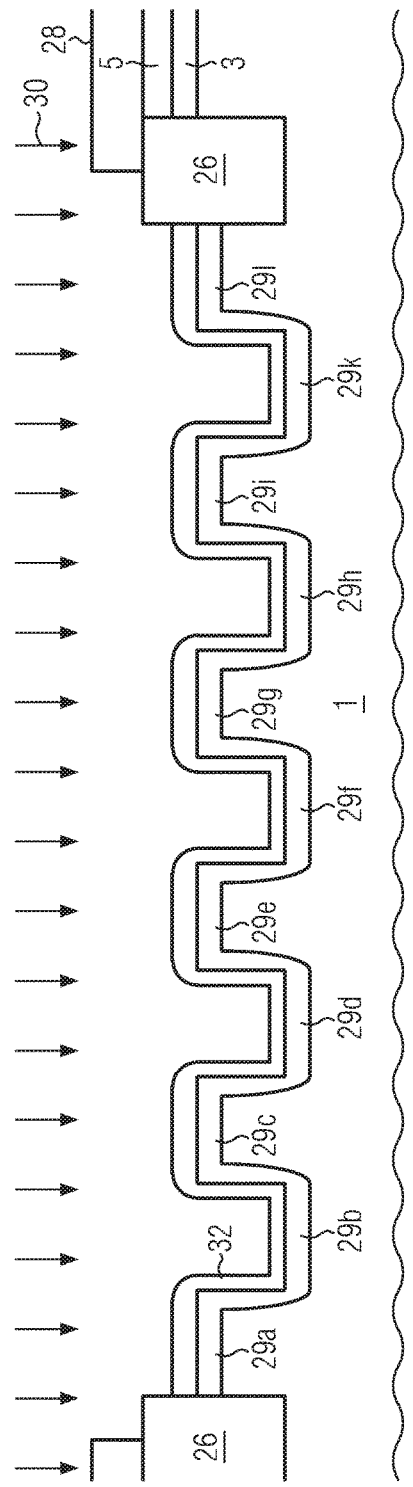
Figure 2G:
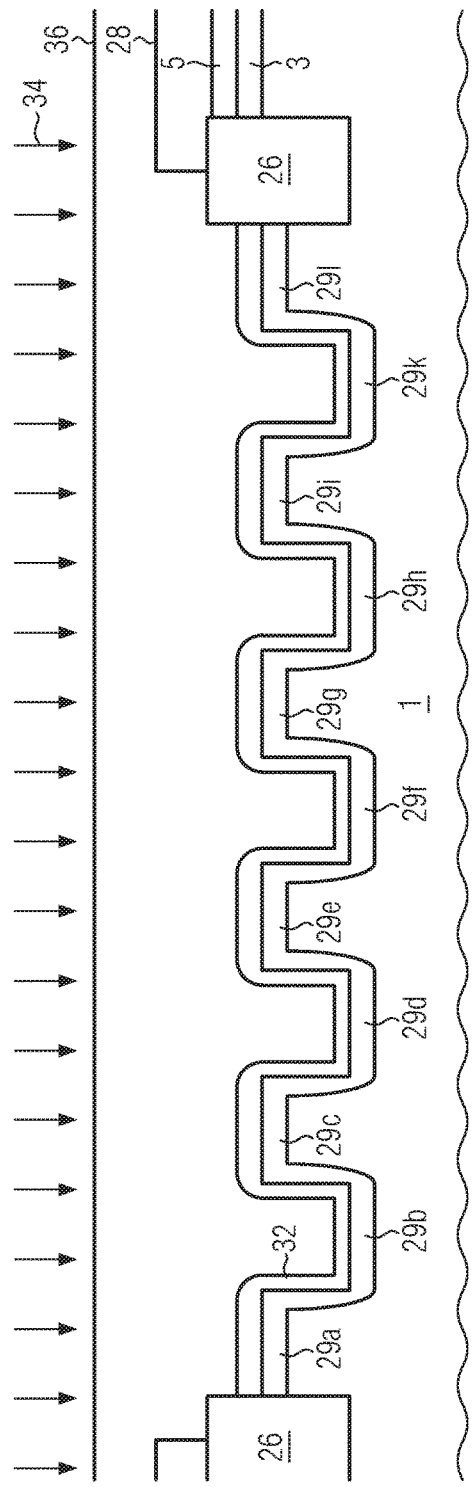

With regard to FIG. 2*f*, the structure of FIG. 2*g* is schematically illustrated at a more advanced stage during fabrication, after a process 30 is performed, wherein a layer of insulating material 32 may be formed over the first active region. The layer of insulating material 32 may be formed so as to partially fill each of the trenches 24*b* to 24*f*, covering any exposed semiconductor substrate material 1 within the trenches 24*b* to 24*f*. In accordance with some illustrative embodiments, the layer of insulating material 32 may supplement the buried layer of insulating material 3 within the first active region (reference numeral A in FIG. 2*d*) and a continuously extending layer of insulating material may be formed such that any surface of the doped regions may be covered by the layer of insulating material. In accordance with some illustrative embodiments of the present disclosure, the layer of insulating material 32 may comprise silicon oxide.

In accordance with some illustrative embodiments as depicted in FIG. 2*f*, the process 30 may be blanket deposited by TEOS techniques. Alternatively, the layer of insulating material 32 may comprise a thermal oxidation process which is applied to the exposed semiconductor substrate material 1, e.g., a dry oxidation process (in this case, the layer of insulating material 32 would be formed by consuming exposed material of the substrate material 1 in the first active region in alignment with the masking pattern 28).

Next, as illustrated in FIG. 2*g*, a process 34 may be performed, the process 34 comprising depositing an electrode material 36 over the first active region and filling (optionally overfilling) the trenches 24*b* to 24*f* of FIG. 2*f*. In accordance with some illustrative embodiments of the present disclosure, the electrode material may be one of a metal or metal alloy material used for forming gate electrodes, polysilicon, or amorphous silicon.

FIG. 2*h* schematically illustrates the structure as depicted in FIG. 2*f* at a more advanced stage during fabrication, after a process 38 is completed. In accordance with some illustrative embodiments, the process 38 may comprise a mask pattern removal process, and optionally a planarization process. As a result of the process 38, the masking pattern 28 may be removed and the electrode material 36 may be planarized, e.g., via CMP.

Accordingly, at the stage as illustrated in FIG. 2*h*, the semiconductor layer 5 may be replaced in the first active region by the electrode material 36 and the electrode material 36 may be electrically insulated from the semiconductor substrate material 1 by means of the layer of insulating material 32 and the buried insulating material layer 3.

With regard to FIGS. 3*a* and 3*b*, further processing of the second active region will be explained below in greater detail.

FIG. 3*a* schematically illustrates the structure of FIG. 2*h* at a more advanced stage during fabrication, after a masking pattern 40 is formed over the first active region, protecting the first active region from further processing, while at least partially leaving the second active region exposed to further processing. At the stage as depicted in FIG. 3*a*, a process 42 may be applied to the exposed SOI substrate 10 in the second active region, the process 42 comprising a step for at least partially removing the semiconductor layer 5 and the buried insulating material layer 3 in the second active region, thereby exposing an upper surface region 6 of the semiconductor substrate material 1 in the second active region. In accordance with some special illustrative examples herein, the exposed upper surface 6 of the semiconductor substrate material 1 in the second active region may be directly adjacent to the STI region 26.

In accordance with some illustrative embodiments of the present disclosure, the process 42 may comprise a sequence of anisotropic etchings to successively remove the exposed semiconductor layer 5 and the buried insulating material layer 3 in accordance with the masking pattern 40.

With regard to FIG. 3b, the structure of FIG. 3a is schematically illustrated at a more advanced stage during fabrication, after a process 44 is applied and a semiconductor material 46 is formed in the second active region in accordance with the masking pattern 40. In accordance with some illustrative examples, the process 44 may comprise a process of epitaxially growing an undoped or doped epi semiconductor material 46, e.g., silicon, silicon germanium and the like, on the exposed upper surface 6 in the second active region.

In accordance with some special illustrative examples of the present disclosure, the process 44 may comprise a process of epitaxially growing a highly doped semiconductor material, e.g., silicon, silicon germanium and the like, on the exposed upper surface 6 in the second active region, the epitaxially grown semiconductor material being doped by a dopant at a comparatively high dose of a donor or acceptor type species, such as on the order of about $10^{18}$ cm$^{-3}$ or more, $10^{19}$ cm$^{-3}$ or more, or $10^{20}$ cm$^{-3}$ or more.

With regard to FIG. 3c, the structure of FIG. 3b is schematically illustrated at a more advanced stage during fabrication, particularly after a silicide region 47 is formed on the electrode material 36 in the first active region, and a silicide region 48 is formed on the deposited epi material 46 in the second active region.

In accordance with some illustrative examples, the silicide regions 47 and 48 may be formed in accordance with known techniques, such as depositing a metal material, such as nickel and the like, on the electrode material 36 and the deposited epi material 46 in the first and second active regions, performing a thermal annealing, wherein metal material on semiconductor material reacts to form a silicide material, and removing the unreacted metal material relative to the formed silicide material, resulting in the silicide regions 47 and 48 as depicted in FIG. 3c. Subsequently, the silicide regions 47 and 48 may be contacted with contact structures, such as contacts 52 and 54. Accordingly, a capacitor structure may be provided, the contact 52 being coupled to the electrode material 36 representing one electrode of the capacitor structure, while the semiconductor substrate material 1 in the first active region represents the counter or other electrode which is electrically coupled to the contact 54 via the silicide region 48 and the deposited epi material 46.

After a complete review of the present disclosure, the person skilled in the art will appreciate that the capacitor structure as provided in FIG. 3c may have a higher capacitance when compared to a pure planar MIM stack arrangement, due to the corrugated configuration increasing the area of the insulating material 32 by the area of the sidewalls of the trenches 24b to 24f. Therefore, a comparatively high capacitance at relatively low area consumption may be realized.

Furthermore, the processes as described above with regard to FIGS. 1 to 3c may be performed employing techniques that are currently used in advanced FDSOI techniques.

With regard to FIGS. 4a-4f, alternative embodiments of the present disclosure will be described.

Figure 4A:
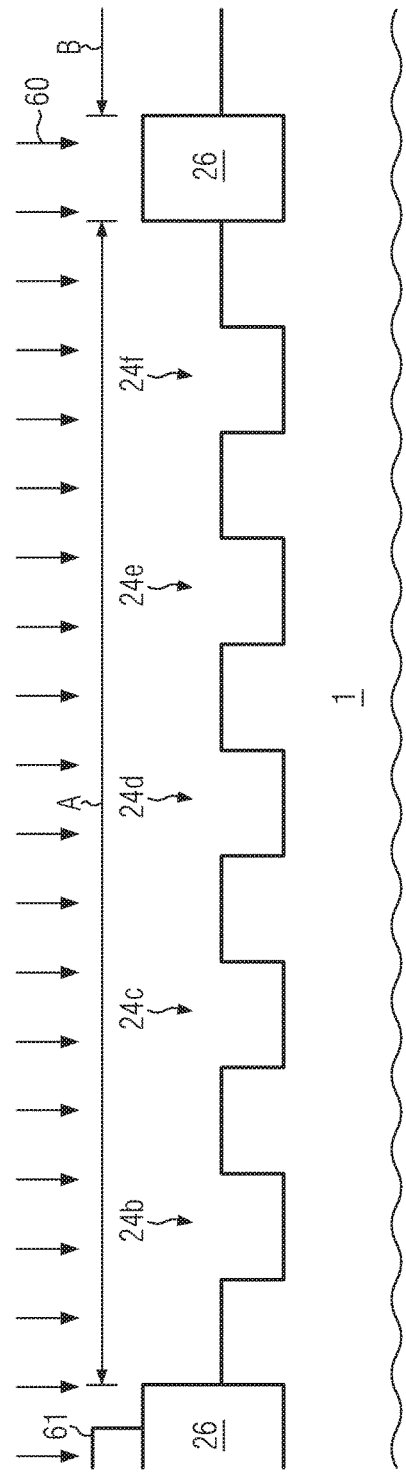

FIG. 4a schematically illustrates the structure as schematically illustrated in FIG. 2d at a more advanced stage during fabrication, wherein a process 60 is applied to the structure as illustrated in FIG. 2d, and the semiconductor layer 5 and the buried insulating material layer 3 may be removed in the first active region A and at least partially in the second active region B (in accordance with a masking pattern 61). Accordingly, the semiconductor substrate material 1 may be completely exposed in the first active region A, while the semiconductor substrate material 1 may be at least partially exposed in the second active region B.

Figure 4B:
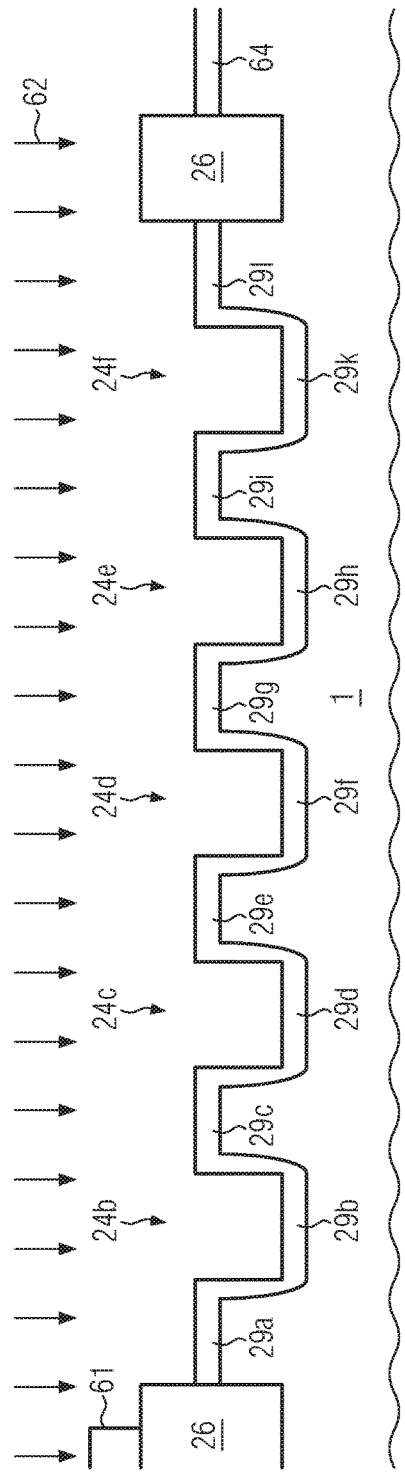

Next, as schematically illustrated in FIG. 4b, a process 62 may be performed, the process 62 being similar to the process 29 in FIG. 2e. Accordingly, doped regions 29a to 29l may be formed in the first active region, similar to the doped active regions 29a to 29l as described above with regard to FIG. 2e, the disclosure of which is incorporated by reference. Furthermore, a doped region 64 may be formed in the second active region in alignment with the masking pattern 61. This does not pose any limitation on the present disclosure and the doped region 64 may be omitted instead by not implanting dopants into the second active region, either because the second active region is covered by a masking pattern, or no implantation is performed at this stage during processing.

Figure 4C:
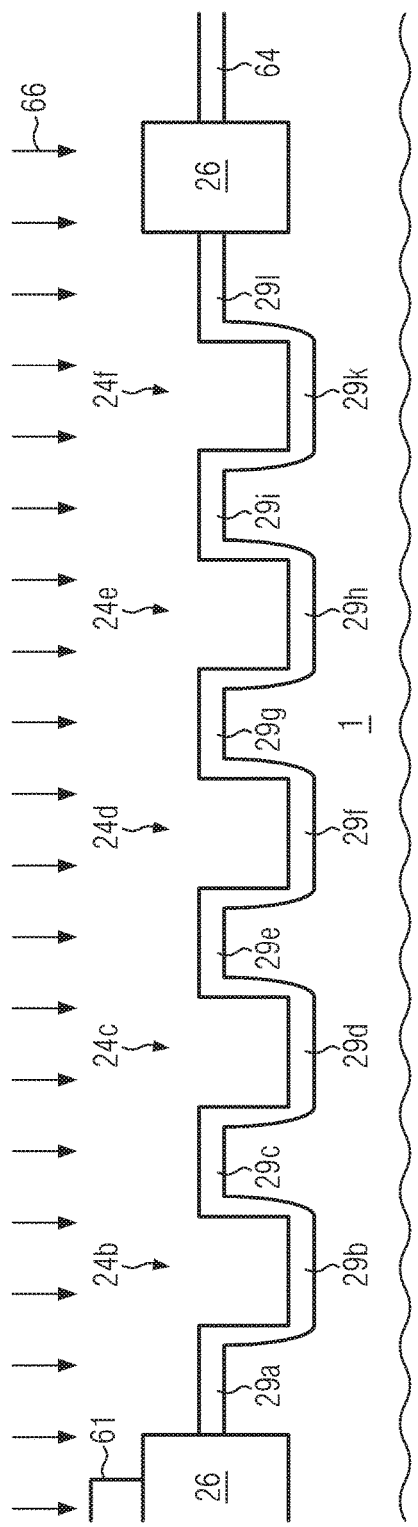

Subsequently, as schematically illustrated in FIG. 4c, a process 66 may be performed. The process 66 may comprise a step of removing the masking pattern 61, and subsequently a step of forming a masking pattern (e.g., masking pattern 70 in FIG. 4d) for protecting the second active region from further processing, while leaving the first active region exposed to further processing.

Figure 4D:
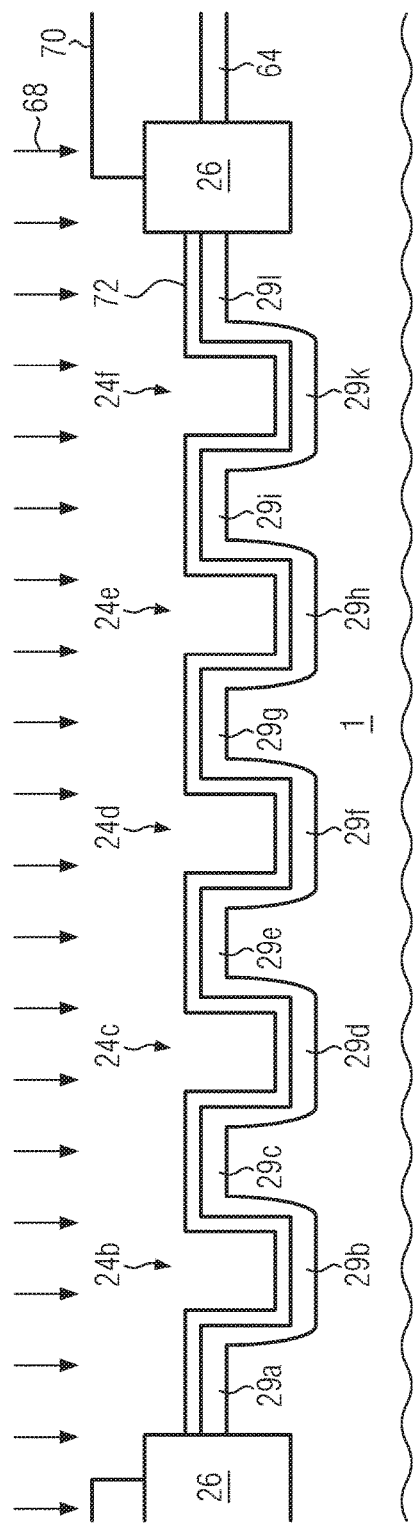

FIG. 4d schematically illustrates the accordingly provided structure having the masking pattern 70 formed so as to expose the first active region to further processing by means of a process 68, while protecting the second active region from the process 68.

In accordance with illustrative embodiments of the present disclosure, the process 68 may comprise a sequence for depositing a layer of insulating material 72 over the first active region, the layer of insulating material 72 covering the exposed semiconductor substrate material 1. In accordance with some special illustrative examples herein, the layer of insulating material 72 may be formed by thermal oxidation, e.g., dry oxidation or TEOS.

With regard to FIG. 4e, the structure of FIG. 4d is schematically illustrated at a more advanced stage during fabrication, after an electrode material 74 is formed in the first active region, directly on the layer of insulating material 72, and the masking pattern 70 is removed. After an optional planarization process, e.g., CMP (not illustrated), the structure as depicted in FIG. 4e may be obtained.

Subsequently, a doped or undoped material may be epitaxially grown on the material 64 in the second active region (while the first active region is optionally covered by an appropriate masking pattern).

Next, as illustrated in FIG. 4f, a capacitor structure may be obtained after forming silicide regions 76 in the first active region on the electrode material 74, and on an epitaxially grown material 75 in the second active region (see silicide regions 76 in FIG. 4f), and forming contacts 77 on the silicide regions 76.

After a complete review of the present disclosure, the person skilled in the art will appreciate that the capacitor structure as provided in FIG. 4f may have a higher capacitance when compared to a pure planar MIM stack arrangement, due to the corrugated configuration increasing the area of the insulating material 72 by the area of the sidewalls of the trenches 24b to 24f. Therefore, a comparatively high capacitance at relatively low area consumption may be realized.

Furthermore, the processes as described above with regard to FIGS. 1, 2-2d and 4a-4f may be performed employing techniques that are currently used in advanced FDSOI techniques.

In summary, the present disclosure provides a method of forming a capacitor structure and a capacitor structure. In accordance with some illustrative embodiments herein, a semiconductor-on-insulator substrate is provided, comprising a semiconductor layer, a buried insulating material layer and a semiconductor substrate material. A shallow trench isolation structure defining a first active region on the SOI substrate is formed, the first active region having a plurality of trenches formed therein. Within each trench, the semiconductor substrate material is exposed on inner sidewalls and a bottom face. A layer of insulating material covering the exposed semiconductor substrate material is formed and an electrode material is deposited on the layer of insulating material in the first active region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a capacitor structure, comprising:
providing a semiconductor-on-insulator (SOI) substrate, said SOI substrate comprising a semiconductor layer, a buried insulating material layer and a semiconductor substrate material;
forming a plurality of trenches in said SOI substrate, said semiconductor substrate material being exposed on inner sidewalls and a bottom face of each trench of said plurality of trenches;
forming a masking pattern covering a subset of said plurality of trenches;
with said masking pattern in place, forming an insulating material in first and second trenches adjacent each end of said subset not covered by said masking pattern to define isolation structures in said first and second trenches and a first active region including said subset of said plurality of trenches, said masking pattern preventing said insulating material from being formed in said subset of said plurality of trenches;
forming a layer of insulating material over said first active region, said layer of insulating material covering said exposed semiconductor substrate material;
depositing an electrode material on said layer of insulating material in said first active region and in said plurality of trenches; and
forming a contact structure coupled to said electrode material, wherein said electrode material is contiguous in said plurality of trenches after forming said contact structure.

2. The method of claim 1, wherein forming said layer of insulating material comprises only partially filling each of said plurality of trenches.

3. The method of claim 1, further comprising implanting dopants into said semiconductor substrate material after forming said plurality of trenches and before forming said layer of insulating material.

4. The method of claim 1, wherein forming said isolation structure comprises forming deep trenches into said SOI substrate, said deep trenches laterally delimiting said first active region against one or more adjacent active regions.

5. The method of claim 4, wherein said semiconductor substrate material is at least partially exposed in a second active region being comprised of said one or more adjacent active regions.

6. The method of claim 5, further comprising forming a contact over said second active region, said contact being electrically coupled to said exposed semiconductor substrate material in said second active region.

7. The method of claim 5, further comprising implanting dopants into said semiconductor substrate material in said first and second active regions after forming said plurality of trenched and before forming said layer of insulating material.

8. The method of claim 1, wherein said depositing of said electrode material comprises depositing a material comprising one of polysilicon, amorphous silicon, a metal, and a metal alloy.

9. The method of claim 1, wherein depositing said electrode material comprises depositing a silicon material on said layer of insulating material, the method further comprising forming a silicide region on said silicon material.

10. The method of claim 9, further comprising forming a contact over said first active region, said contact being electrically coupled to said silicide region.

11. The method of claim 1, wherein first portions of said buried insulating material layer remain on said semiconductor substrate material between said plurality of trenches after forming said plurality of trenches.

12. The method of claim 11, wherein second portions of said semiconductor layer remain above said first portions after forming said plurality of trenches, and the method further comprises removing said second portions prior to depositing said electrode material.

13. The method of claim 11, wherein said first portions remain on said semiconductor substrate material between said plurality of trenches after depositing said electrode material.

14. A method of forming a capacitor structure, comprising:
providing a semiconductor-on-insulator (SOI) substrate, said SOI substrate comprising a semiconductor layer, a buried insulating material layer and a semiconductor substrate material;

forming an isolation structure that defines a first active region in said SOI substrate;

forming a plurality of trenches in said first active region, said semiconductor substrate material being exposed on inner sidewalls and a bottom face of each trench of said plurality of trenches, wherein first portions of said buried insulating material layer having exposed uppermost surfaces remain on said semiconductor substrate material between said plurality of trenches after forming said plurality of trenches;

forming a layer of insulating material over said first active region and directly on said exposed uppermost surfaces of said buried insulating material layer, said layer of insulating material covering said exposed semiconductor substrate material;

depositing an electrode material on said layer of insulating material in said first active region and in said plurality of trenches; and forming a contact structure coupled to said electrode material, wherein said electrode material is contiguous in said plurality of trenches after forming said contact structure.

15. The method of claim 14, wherein forming said layer of insulating material comprises only partially filling each of said plurality of trenches.

16. The method of claim 14, further comprising implanting dopants into said semiconductor substrate material after forming said plurality of trenches and before forming said layer of insulating material.

17. The method of claim 14, wherein said semiconductor substrate material is at least partially exposed in a second active region being comprised of one or more adjacent active regions.

18. The method of claim 17, further comprising forming a contact over said second active region, said contact being electrically coupled to said exposed semiconductor substrate material in said second active region.

19. The method of claim 17, further comprising implanting dopants into said semiconductor substrate material in said first and second active regions after forming the plurality of trenches and before forming said layer of insulating material.

20. The method of claim 14, wherein depositing said electrode material comprises depositing a silicon material on said layer of insulating material, the method further comprising:

forming a silicide region on said silicon material; and forming a contact over said first active region, said contact being electrically coupled to said silicide region.

* * * * *